United States Patent [19]

Anderson

[11] 4,048,955
[45] Sept. 20, 1977

[54] CONTINUOUS CHEMICAL VAPOR DEPOSITION REACTOR

[75] Inventor: Roger Norman Anderson, Garland, Tex.

[73] Assignee: Texas Instruments Incorporated, Dallas, Tex.

[21] Appl. No.: 609,879

[22] Filed: Sept. 2, 1975

[51] Int. Cl.$^2$ ............................................. C23C 13/10
[52] U.S. Cl. ........................................ 118/49.5; 118/69
[58] Field of Search ................................. 118/48–49.5, 118/50, 50.1; 427/50, 51, 69, 70, 78, 91, 99, 124, 166, 167, 237, 248–252; 34/242

[56] References Cited

U.S. PATENT DOCUMENTS

| | | | |
|---|---|---|---|
| 3,047,438 | 7/1962 | Marinace | 118/49.5 X |
| 3,240,915 | 3/1966 | Carter et al. | 118/49.1 X |
| 3,294,670 | 12/1966 | Charschon et al. | 118/49 X |
| 3,314,393 | 4/1967 | Haneta | 118/48 |
| 3,473,510 | 10/1969 | Sheng et al. | 118/49.5 |
| 3,486,237 | 12/1969 | Sawicki | 118/49 X |
| 3,523,517 | 8/1970 | Corbani | 118/500 |
| 3,645,545 | 2/1972 | Garnache et al. | 118/49 X |
| 3,650,042 | 3/1972 | Boerger et al. | 118/49 X |
| 3,658,032 | 4/1972 | Kohler et al. | 118/48 |
| 3,672,948 | 6/1972 | Foehring et al. | 118/48 |
| 3,742,904 | 7/1973 | Bishop | 118/49.5 X |
| 3,893,876 | 7/1975 | Akai et al. | 118/49.1 X |

*Primary Examiner*—Morris Kaplan
*Attorney, Agent, or Firm*—Harold Levine; James T. Comfort; Gary C. Honeycutt

[57] ABSTRACT

Disclosed is a vapor deposition reactor comprising a series of individual gas cells respectively isolated from each other and containing a particular reactive or nonreactive gas required for one stage in a deposition process. Each cell is provided with an independent temperature control. A substrate is mounted on a carrier and transported through the series of individual cells so that vapor depositions or other related processes may be conducted or performed upon the substrate. Chemical vapor deposition processes such as growth of epitaxial layer, deposition of polycrystalline silicon, nitride, oxide or metals on a substrate may be performed within the reactor. The cells are isolated by viscous loss seals formed by the propinquity of restricted openings in the reactor to substrate carrier configuration.

8 Claims, 11 Drawing Figures

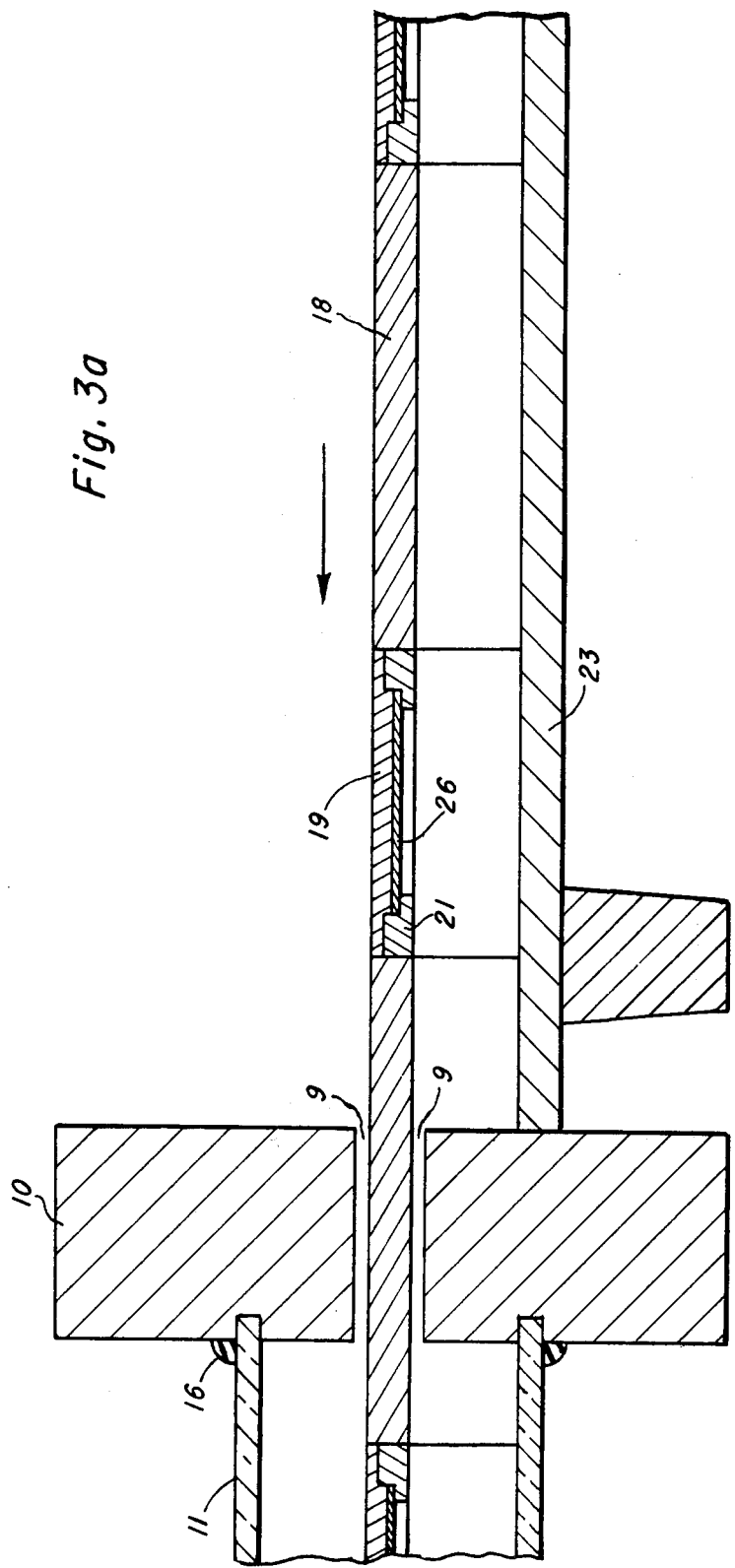

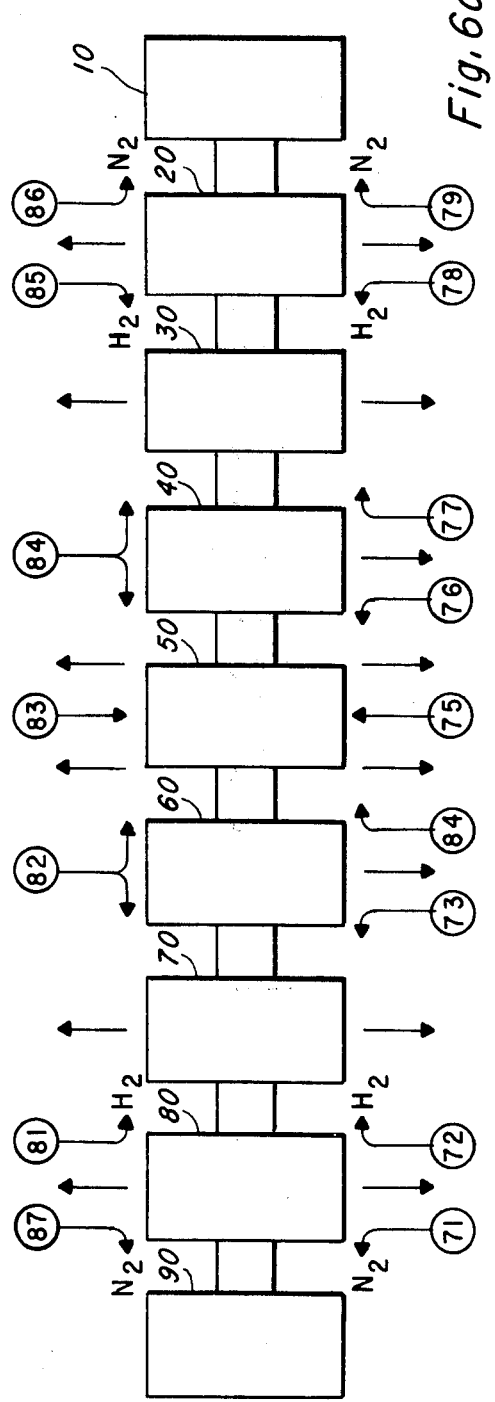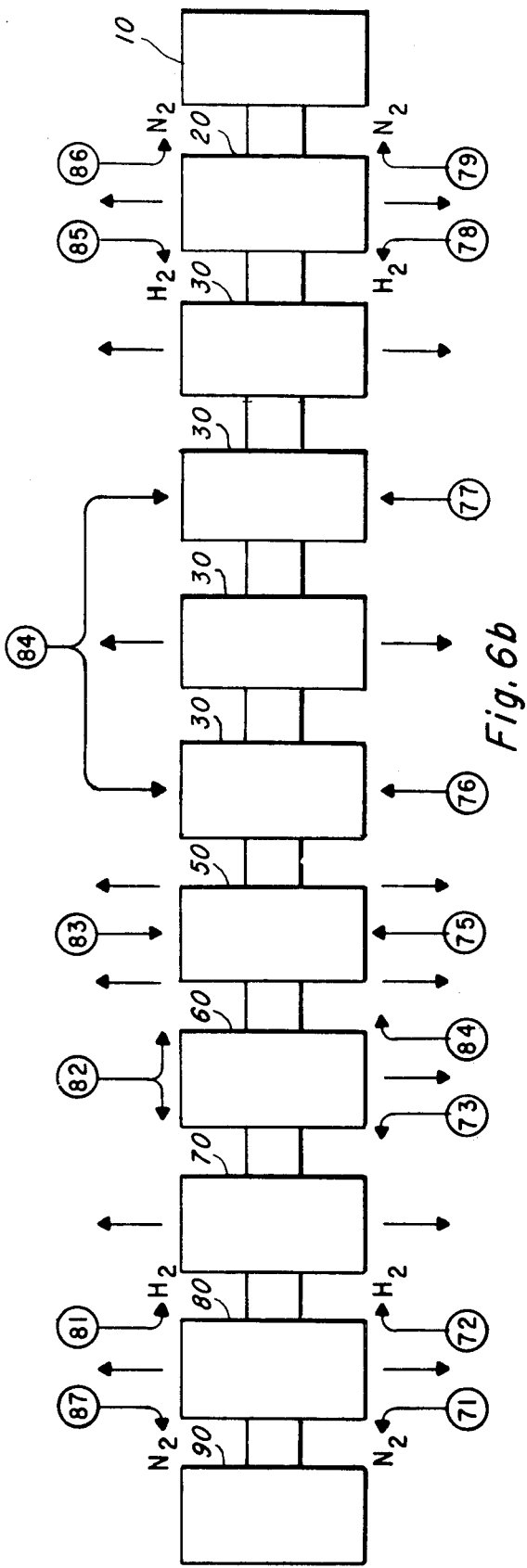

CONTINUOUS CHEMICAL VAPOR DEPOSITION REACTOR

This application relates to vapor deposition reactors and more particular to multiple cell reactors through which a substrate may be passed for the chemical vapor deposition of various materials thereon.

PRIOR ART

In prior art deposition reactors generally a substrate is placed and sealed within a reactor, for example a bell jar, and deposition takes place. In some reactors it may be possible to accomplish several steps in the deposition reactor by rotating the substrate through various sections of the reactor, however, the seal on the reaction chamber must be broken and gases used in the deposition must be removed before the reactor is opened. Also, even if several steps in the reaction process are using the same chamber, the chamber must be purged of any gas or material used in a previous step before the next step can be accomplished. The process therefore cannot be continuous and it is time consuming to cleanse the chamber between steps, open the chamber to remove processed substrates and to place unprocessed substrates into the chamber to repeat the deposition process. A deposition system using carriers to transport a substrate through the reactor is described in U.S. Pat. No. 3,598,082.

A SUMMARY OF THE PRESENT INVENTION

The present invention relates to a multi-chamber continuous chemical vapor deposition reaction through which substrates may be passed in order to perform various deposition processes thereon. A substrate enters one end of the reactor through a port and is moved successively through the various chambers and out the other end of the reactor through another port. The reactor itself is not physically closed but has gas seals at each end and in between each chamber of the reactor. One example of the reactor may include eight chambers in which the first chamber consists of a nitrogen seal, the second a pre-heat chamber, then four deposition chambers, a cool down chamber, and a nitrogen seal. A typical gas supply system will be capable of supplying gases for two different deposition processes which may be directed into any of the four deposition chambers. Each of the chambers is effectively divided into two portions, a top portion and a bottom portion by the substrate carrier. The junctions between the chambers effectively isolate one chamber from the other by the flow gases or the exhaust of gas or gases from the chambers.

The novel features of the invention and the technical advance represented thereby are set forth in the appended claims. The invention itself as well as objects and advantages thereof will be best understood by reference to the following detailed description of an illustrative embodiment taken in conjunction with the accompanying drawings in which:

FIGS. 3a through 3e show in detail the junctions dividing the chambers of the reactor and showing the gas inlets and exhaust outlets within each junction;

FIG. 6a is a block representation of the reactor keyed to the schematic diagram of FIG. 5 showing the input of the gases to the various junctions of the reactor; and FIG. 6b is another possible arrangement of reactor chambers and junctions which may be used with the controls illustrated in FIG. 5.

PREFERRED EMBODIMENT OF THE INVENTION

Figure 1:
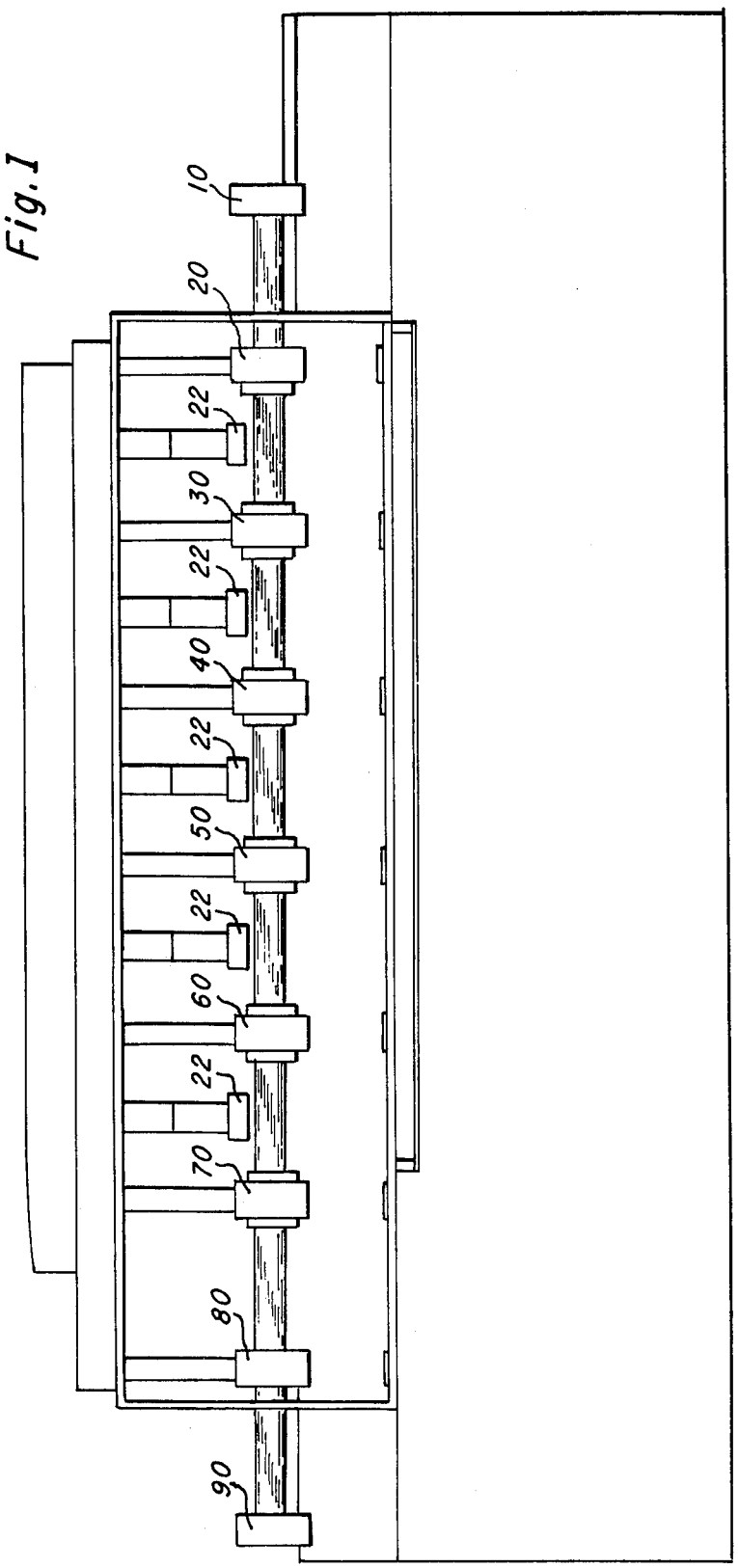
FIG. 1 is a composite view of a reactor showing the basic details of an 8 chamber reactor.

FIG. 1 illustrates an eight chamber or chamber continuous chemical vapor deposition reactor. There are nine junctions, 10, 20, 30, 40, 50, 60, 70, 80 and 90, which divide the reactor into chambers. The eight chambers are basically a nitrogen seal, pre-heat chamber, four deposition chambers, a cool down chamber and a nitrogen seal. The gas supply furnishes gases for two different deposition processes which may be directed into any of the four deposition chambers. The carrier transports a substrate from right to left (as illustrated) through the reactor. The carrier (later described in reference to FIG. 4) divides the gases into a top and bottom section. The substrates are placed inverted in the carrier and a lid is placed on top. This lid becomes the susceptor for radiant heat from quartz lamp 15 included in assemblies 22. Deposition gases flow into the bottom section of each chamber and a protective flush using the same gas as the carrier gas for the deposition processes is put into the top of the chamber.

Figure 2:
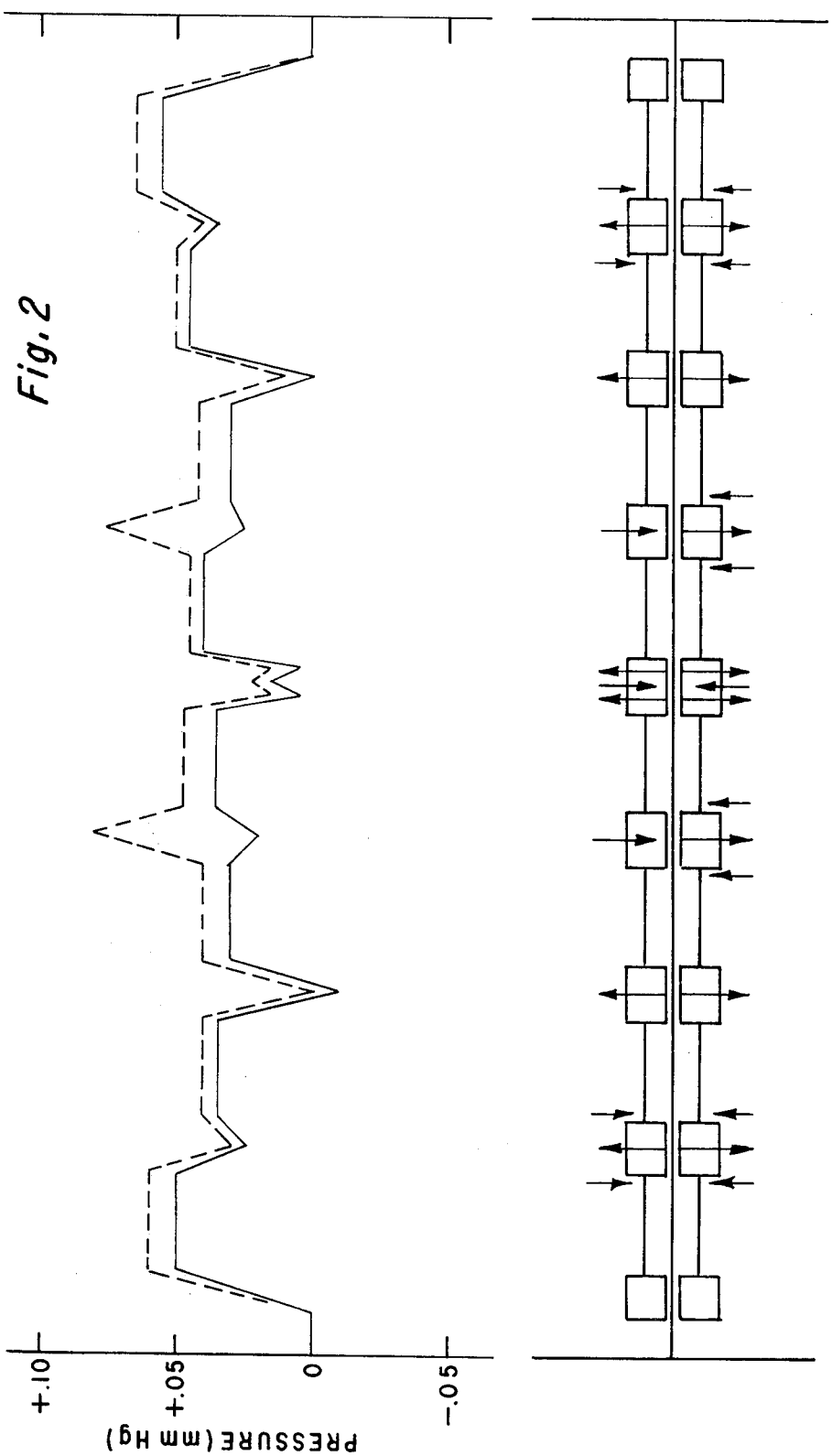
FIG. 2 is a pressure diagram showing the pressure at various points in the reactor.

FIG. 2 is a chart showing the gas pressure throughout the reactor. The gas pressure in each of the chambers is such that each chamber is isolated one from the other. The dashed lines represent the gas pressure in the top of the chamber and the solid lines represent the various pressures throughout the reactor in the lower portion of each chamber. The horizontal location of the pressure corresponds to the sketch of the reactor (at a given position) directly under the pressure chart. The relatively large pressure changes occur across the viscous loss seals in the junctions. Very small pressure changes occur within the chamber. The pressures throughout the system are controlled by proper choice of junction clearances and gas flow rates. It may be observed that the pressures in the nitrogen seals are above atmospheric pressure to keep the ambient outside the chamber from entering into the reactor.

FIGS. 3a through 3e illustrate in more detail the reactor showing the design of each of the five types of junctions which separate the chambers. The junctions are symmetrical about the center junction. The outer junctions 10 and 90 contain two viscous loss seals (one top and one bottom). Junctions 20, 30, 40, 60, 70 and 80 contain four viscous loss seals each. Junction 50 contains eight viscous loss seals.

Figure 3B:
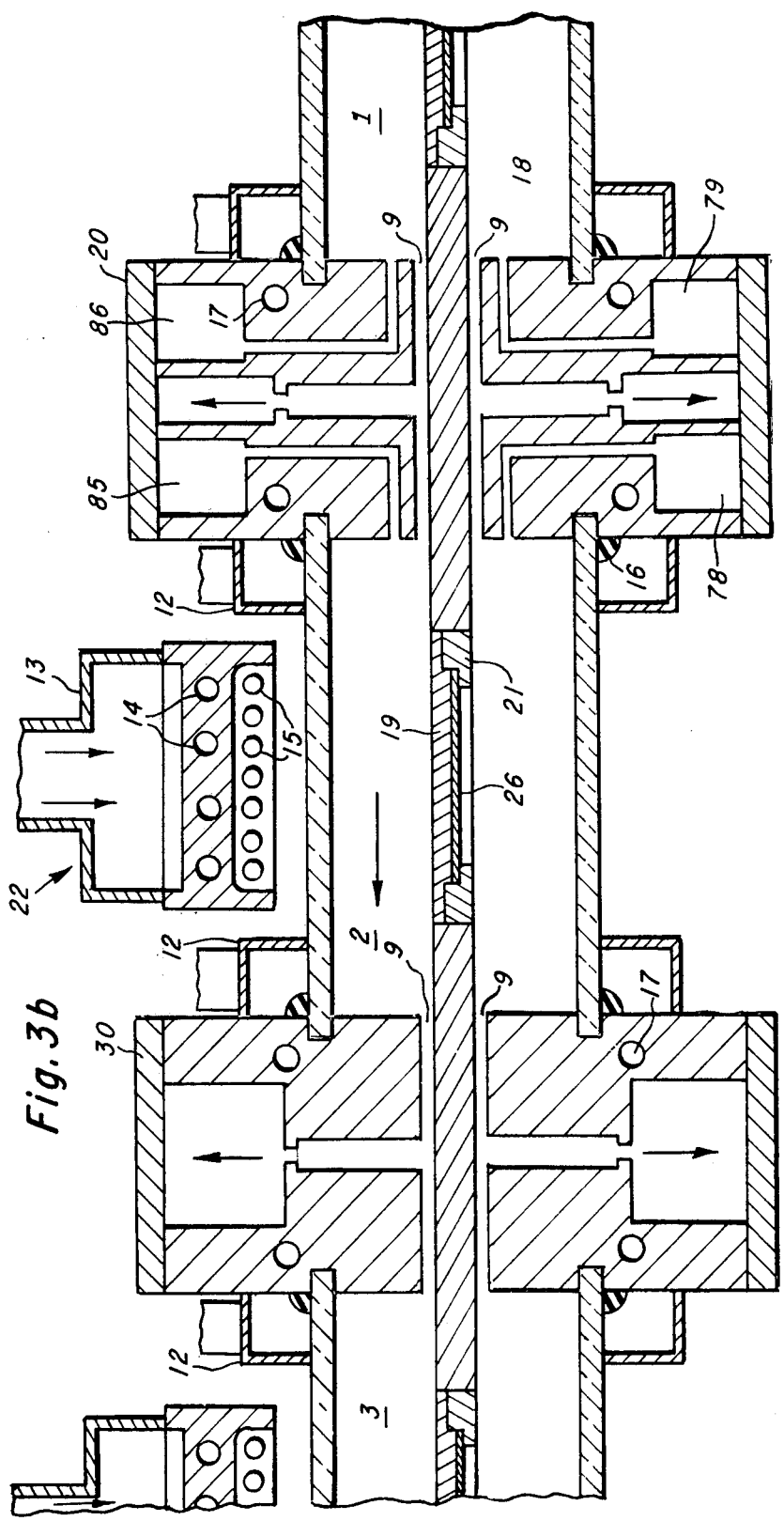
Figure 3C:
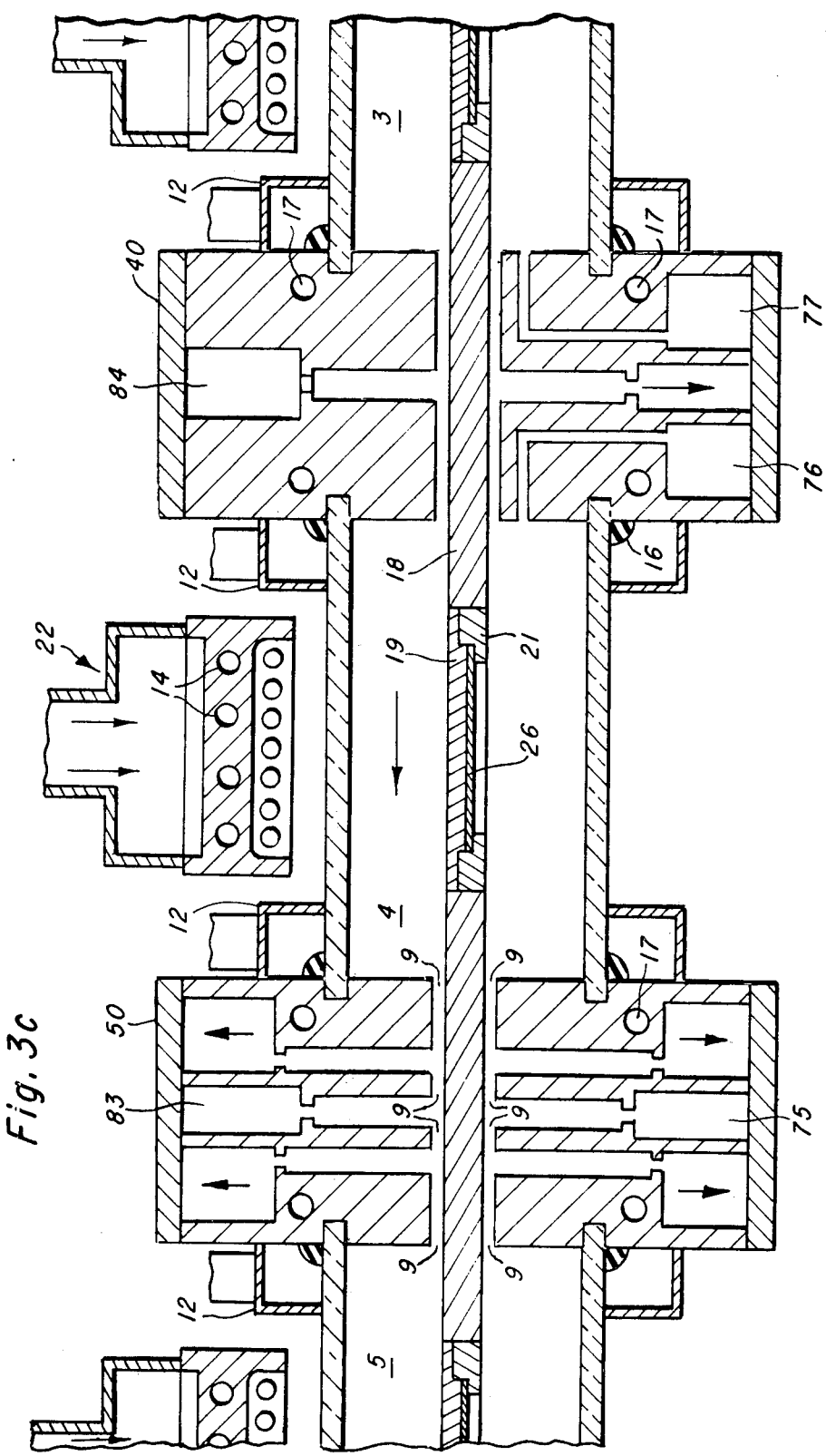
Figure 3D:
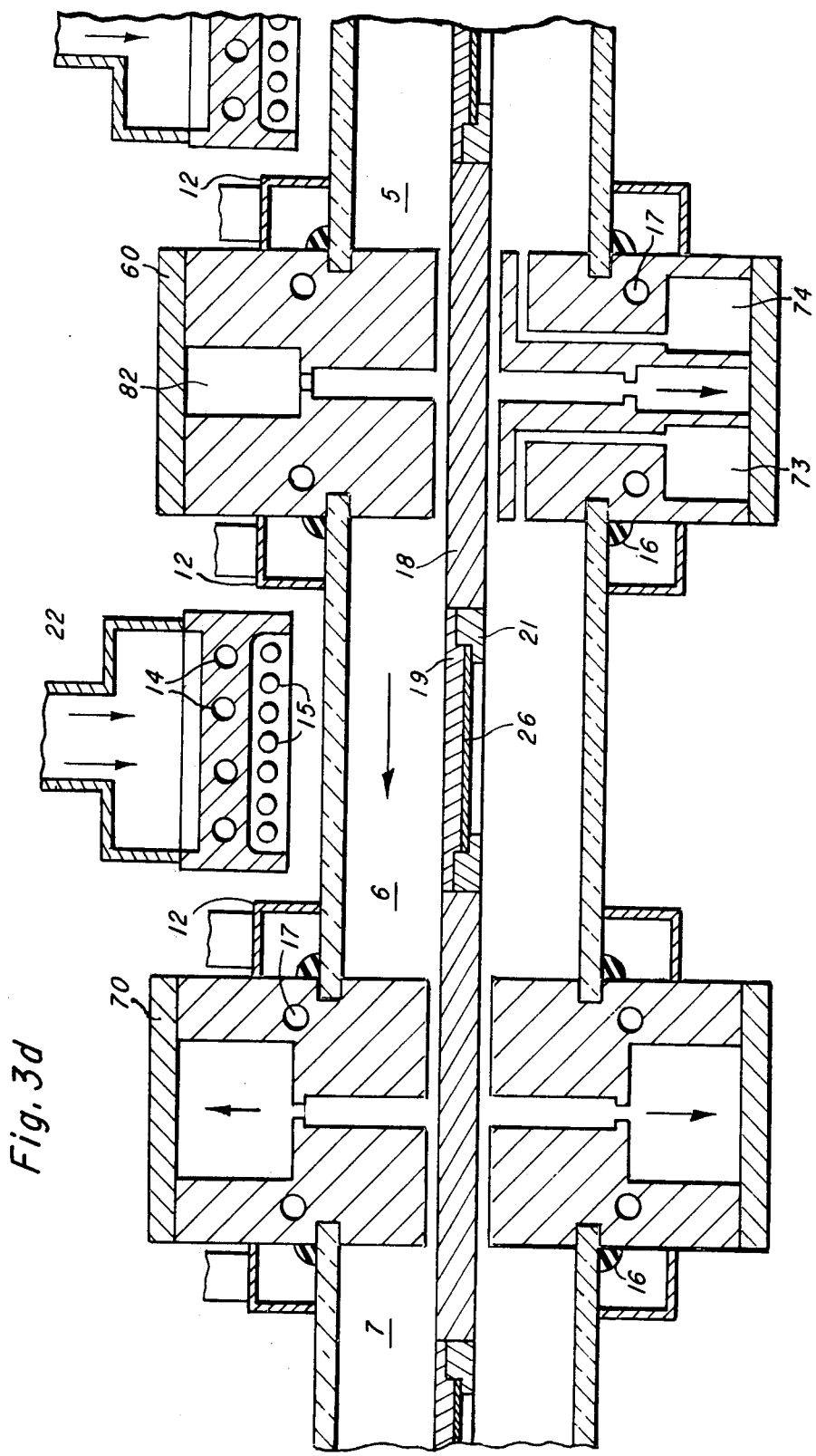
Figure 3E:
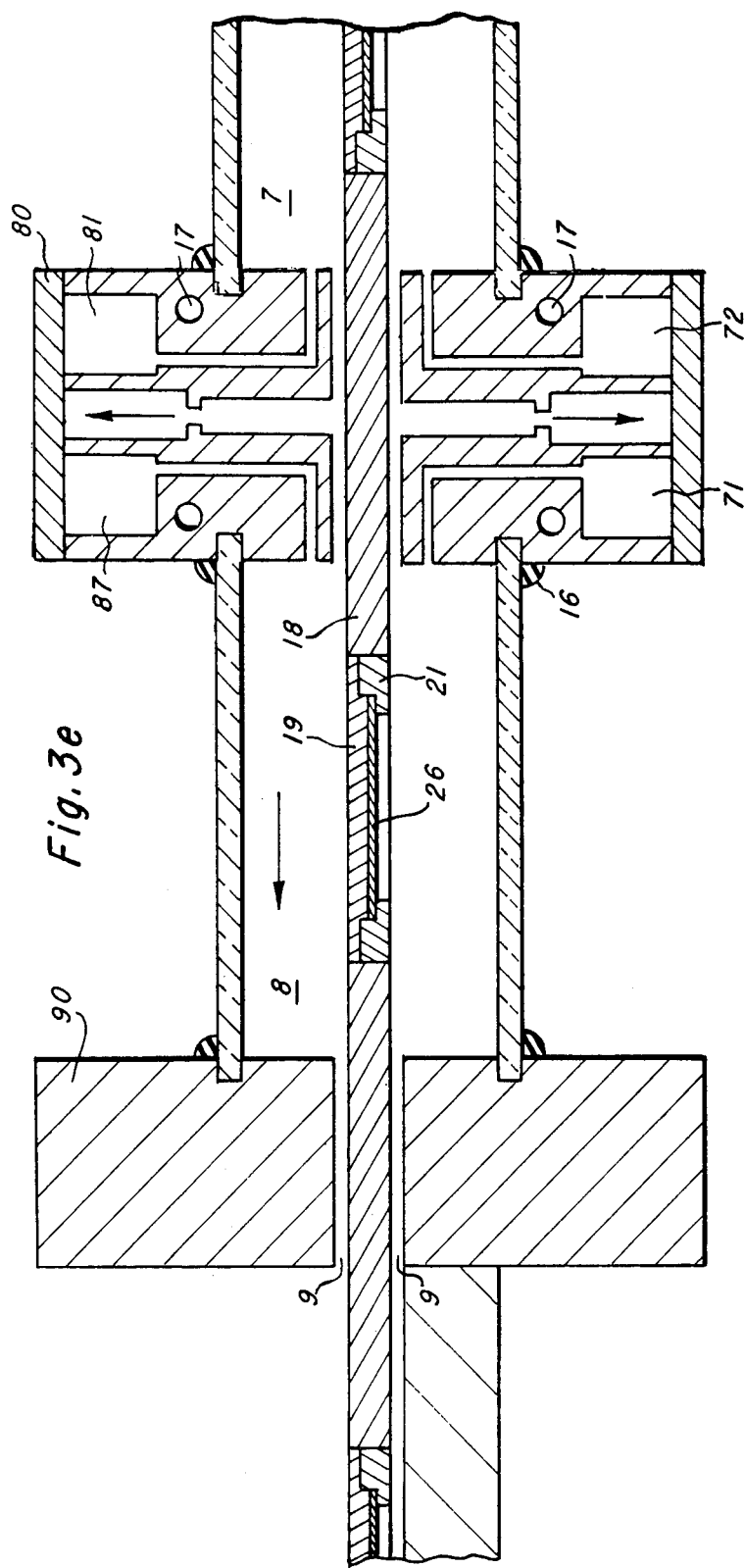

The essential features of a viscous loss seal are explained with respect to junctions 10 and 90, FIGS. 3a and 3e. They are designed to give a viscous pressure drop between the nitrogen cell and the atmosphere. This pressure drop serves two purposes. First, it provides a buffer against room air turbulence pressure fluctuations. Most pressure fluctuations of room air have a maximum of 0.005 millimeters of mercury. The dimensions and flow rate of this junction are chosen so to give about 0.050 millimeters of mercury pressure drop between the nitrogen seal and atmosphere. This is an order of magnitude higher than room air pressure fluctuations, which effectively negates any room air turbulence effects.

The second purpose is to provide a long enough section, for a given exit velocity, to bring counter diffusion of air into the nitrogen to an acceptably low level. It can be shown that diffusion counter to a laminar flow stream results in a decrease in diffused species concentration which is the negative exponential function of an isolation factor defined as the product of the volume flow rate and seal length divided by the product of the cross sectional area and the species diffusivity. In this factor is 20, for example, then the species reduction (effective isolation) is $5(10)^8$. The seal dimensions and gas flow rates are thus chosen such that the isolation factor is sufficiently high.

These same considerations are in effect for all the other viscous loss seals even though the junctions are physically more complex and involve different gases. The exhausts from each of the junctions have to be unrestricted such that they operate at near atmospheric pressure. This allows each of the chambers to be unaffected by changes in volume flow rate or temperature in an adjacent chamber. The chambers are thus isolated from each other by the viscous loss seals and the individual exhausts may be routed into a common exhaust collector.

Junctions 20 (FIG. 3b) and 80 (FIG. 3e) have two inputs both top and bottom and a central exhaust. They allow different but compatible gases to be put into adjacent cells. The gases have to be compatible since they both flow to the center exhaust. The viscous loss seals prevent exchange between the exhaust and the chambers.

Junction 30 (FIG. 3b) and junction 70 (FIG. 3d) are single purpose exhaust junctions. They exhaust the major part of the flow from either the preheat and first deposition or the cooled down and last deposition chambers, specifically junction 30, exhaust chambers 2 and 3, and junction 70, exhaust chambers 6 and 7.

Junction 40 (FIG. 3c) and junction 60 (FIG. 3d) are similar to junctions 20 and 80 except each has a single top input. The bottom section of each allows independent choice for the two adjacent deposition chambers. Junction 40 allows separate inputs to chambers 3 and 4 and junction 60 allows separate inputs to chambers 5 and 6.

Junction 50 (FIG. 3c) is unique. Its purpose is to isolate the exhaust gases in the second deposition chamber 4 from those in the third deposition chamber 5. This allows deposition processes whose gases are not compatible to be performed in adjacent chambers. The center input is of a gas which is compatible with both deposition processes. The left exhaust of junction 50 is routed into a collector which is common for all exhausts in the left half of the reactor. This exhaust is routed to a burn off (not illustrated). The right exhaust of junction 50 is routed into a collector for the right half of the reactor to which has its own burn off.

By proper choice of the viscous seal dimensions and the volume flow inputs, the pressures throughout the system can be controlled. The pressure measurements throughout the system are made by using a capacitance manometer which can be routed to any section of the interior gas system and reference to atmospheric pressure. The measurements for a typical system are shown in the previously mentioned FIG. 2.

Chambers 2 through 6 may be heated by assembly 22 which includes quartz lamps 15. This assembly has provision for water cooling 14 and air cooling 13. On each side of junctions 20 through 70 are cooling ducts 12 through which cooling air may be directed to remove heat from the junctions. The chambers themselves are made of quartz tube which connect between the junction. These tubes 11 are sealed with a silicon rubber seal 16 to prevent gas leakage from the junctions into the cooling ducts 12 and into the outer atmosphere.

Figure 4:
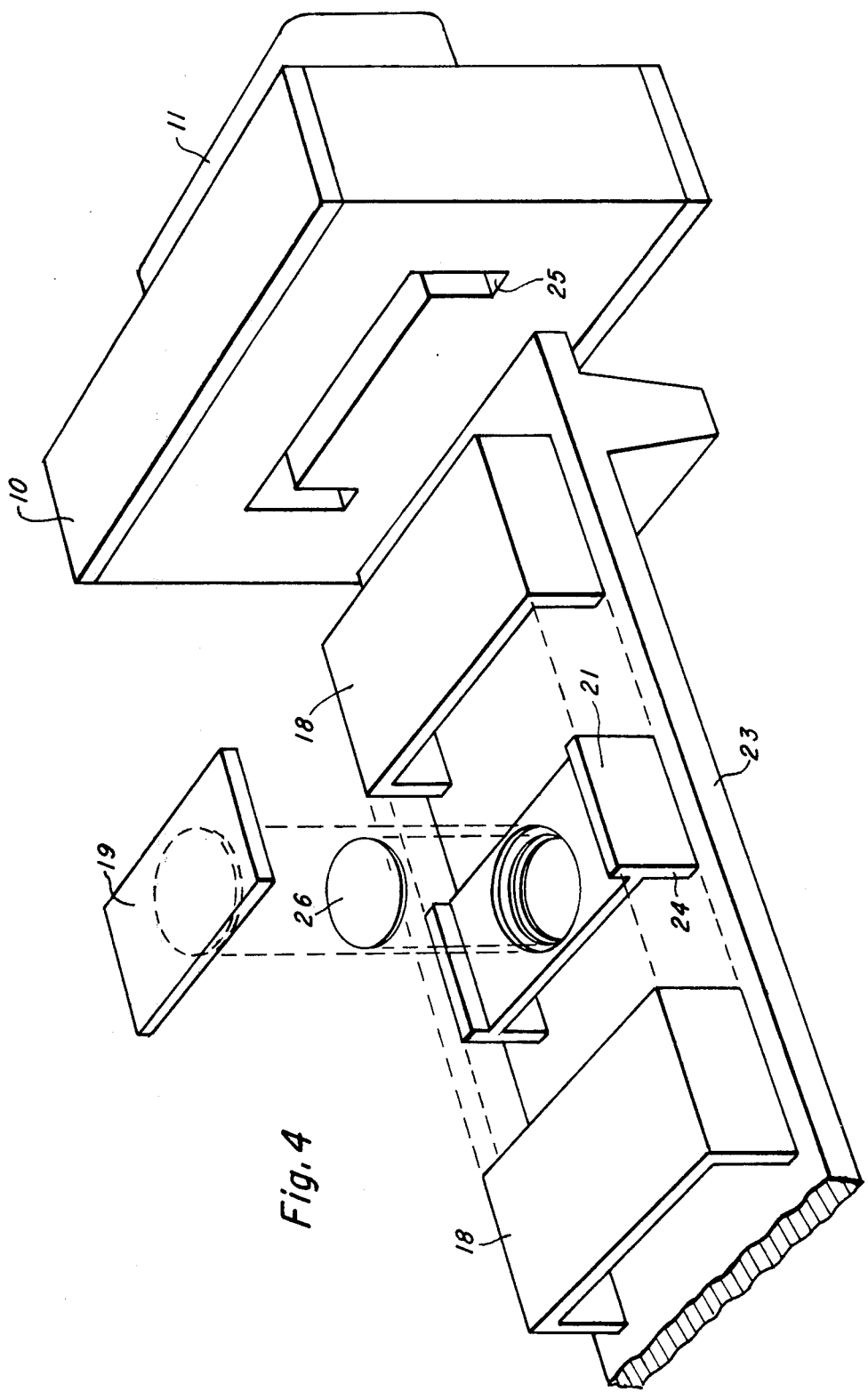
FIG. 4 is a detailed pictorial view of the substrate carrier in the junction which forms the entrance to the reactor.

Looking at FIG. 4 there is illustrated the entrance ramp and first junction of the reactor. A substrate carrier 21 has a substrate 26 inserted in an opening therein which opens through to the bottom of the carrier and a lid 19 is placed on top of the substrate. This lid serves as a susceptor for the radiant heat from the lamp 15. On either side of the carrier are spacers 18. The carrier and spacers are moved through the reactor such that when a substrate is stopped in a chamber other substrates within the reactor are spaced so that they will also reside in a chamber. The carrier physically divides the tubes 11 into upper and lower chambers as previously mentioned. All deposition takes place in the lower chamber while a protective gas the same as a carrier gas is introduced into the upper chamber. The carrier 21 and spacers 18 ride on the ramp 23 and travel through opening 25 in the first junction into the reactor. It is the closeness of fit of the carrier and the spacers and the opening 25 which provide the seal for the reactor. The viscous properties of the gas within the chambers prevent the atmosphere from flowing into the chambers through the entrance of the reactor.

Figure 5:
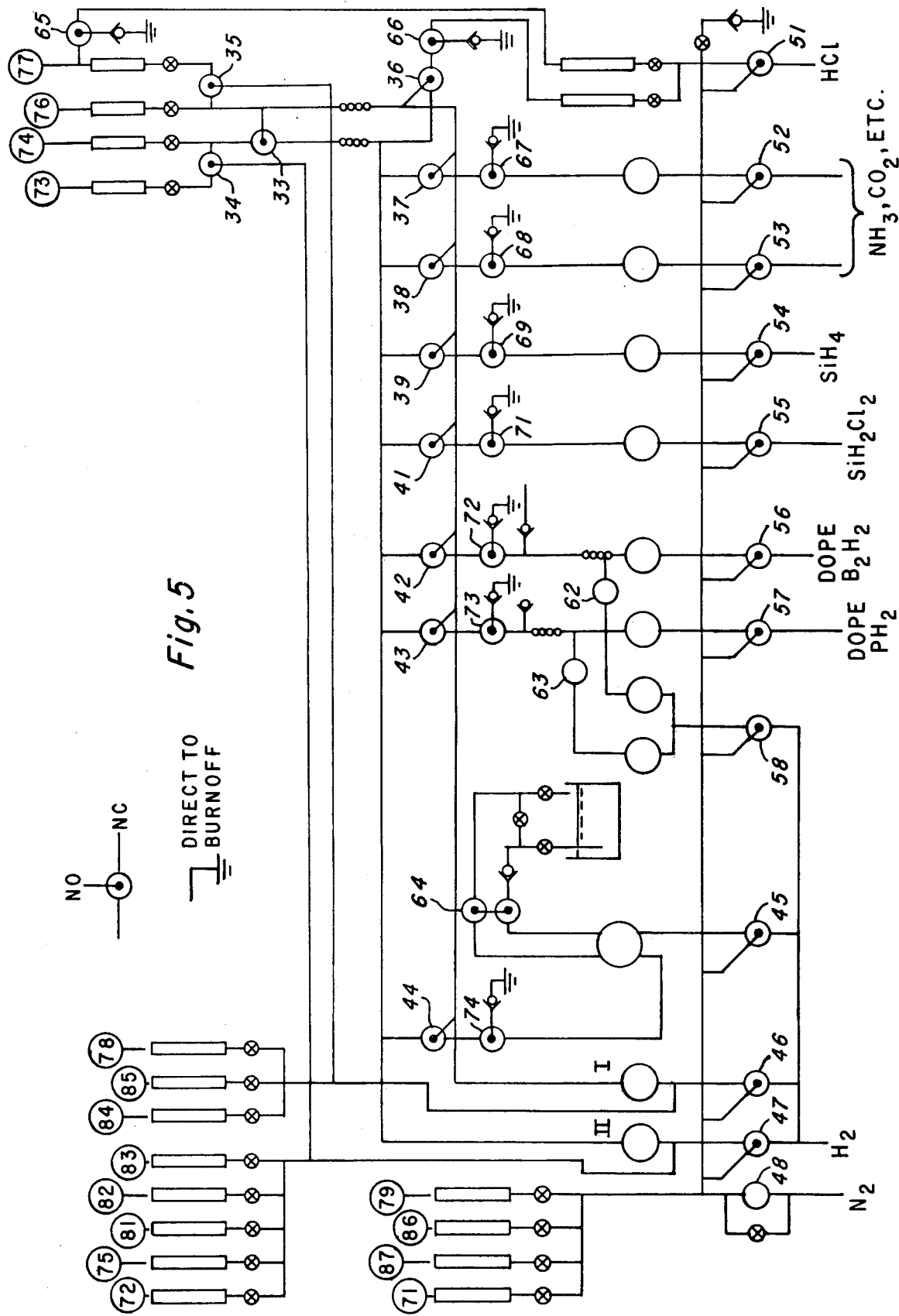
FIG. 5 is a schematic diagram of the controls which regulate the flow of gases into the reactor.

The gas supply system for the reactor is illustrated in FIG. 5. There are two carrier gas systems which may be routed to any of the four deposition chambers by appropriate selection of valves 33, 34 and 35. In the de-energized position system I is routed to the two central deposition chambers 74 and 76. Activation of valve 34 gives process gas at 73 and activation of valve 35 gives process gas at 77. If valve 33 is energized, (without 34 and 35) processed gas from system I goes only to 76. Process gas from system II goes into 74. As before; 34 and/or 35 may be activated to increase the number of deposition chambers. Valves 36 through 39 and 41 through 44 route individual gases into either the I or II carrier gas systems.

A four step start up sequence is employed which is as follows. The first step energizes valve 48, which puts nitrogen through all parts of the reactor and gas system. Valves 33 through 39 and 41 through 44 are preset and are energized by the same power input as valve 48.

The second step turns on valves 45, 46 and/or 47 (if they are preset). This admits hydrogen into the deposition and adjacent junctions. If a hydrogen carrier gas is used in system I, then the pre-heat and first two deposition top chambers will also contain hydrogen. If the hydrogen carrier gas is used in system II, then the cool down and last two deposition top chambers as well as the central split exhaust junction purge will be hydrogen. The cooling air and water, and the heaters 15 may be turned on at this time.

The third step turns on valves 51 through 58 (whichever are preset). This turns on the particular reactive gas desired for the deposition process. Valves 62, 63 and/or 64 (if desired) are also activated at this time. These gases are routed directly to burn off.

The fourth step switches the reactive gases from burn off into the carrier gas stream. Valves 65 through 69 and 71 through 73 (whichever are preset) come on at this time. This is the normal start up sequence. Each step is inhibited by appropriate safety interlocks. Once the reactor is on it operates at a steady state with the slice carriers advanced at regular periodic intervals.

FIG. 6a is a block diagram of the reactor illustrating the various gas flow directions in the junctions. All arrows extending away from the block represent exhausts from the junctions and are not numbered. The gas input ports are numbered and are keyed into the output of the control system shown in FIG. 5. The overall junction flows in FIG. 6a are also shown in the detail junction diagrams in FIGS. 3a through 3e. As previously mentioned exhaust ports from each half of the reactor are routed to common burn off exhausts.

It should be noted that the junction arrangement shown in FIG. 6a is compatible with the gas feed system described in FIG. 5 for a two process reactor, with individual control of 4 deposition chambers. Other arrangements of the junctions than that shown in FIG. 6a could be made depending on the desired reactor capabilities. Additional junctions could be added for example as shown in FIG. 6b in which junctions of the type 30 (FIG. 3b) are used for input instead of exhaust. This eliminates the wasted center exhaust between inputs 76 and 77 (FIG. 6a) if both inputs had the same composition, and extends the deposition process time for a given through put rate. Other variations in junction arrangement and corresponding modifications to the gas feed system are possible as logical extensions to those illustrated in FIGS. 5, 6a and 6b.

In using the reactor, as decision is made as to which depositions are to be made on a substrate and in which chambers. The valves in the control system are preset to the desired flow rates. The train of carriers are indexed by the spacers so that with each move a carrier is indexed to the next chamber. As the substrates are routed into the input of the reactor, processed substrates exit out the further end. By virtue of the effective isolation of the various chambers by the flow of gases, a continuous train of substrates may be moved through the reactor forming a continuous process. The systems may be tailored to any number of combination a chemical vapor deposition processes including epitaxial, polycrystalline silicon, nitride, oxide or metal deposition by selecting the number, order and length of chambers, and using the appropriate gases, chamber temperatures and cycle time for a given process. The continuous deposition reactor permits the effective isolation of the various chambers so that non-compatible gases may be used in adjacent chambers and different desposition processes carried out simultaneously. The reactor may be modified by changing modules with different chambers and junctions. This flexibility provides a reaction chamber by which substrates may be continuously processed and any number of processes and combinations of steps in the process. Each chamber is of a quartz structure. It may be removed for cleaning and replaced without a major tear down of the overall reactor.

Other advantages, features and technical advances provided by the continuous vapor deposition reactor will be apparent from the foregoing description when taken into conjunction with the following claims.

I claim:

1. A continuous chemical vapor deposition reactor comprising:
    an elongated central core having a restricted opening at each end communicating to the outside atmosphere;
    a plurality of junction units interdisposed between said ends and dividing said elongated central core into a plurality of interconnected chambers comprising sealing chambers and substrate treating chambers and each unit having a restricted passageway therethrough aligned with and communicating adjacent ones of said chambers;
    a plurality of substrate carriers and spacers travelling into, through and out of said elongated central core;
    a plurality of viscous loss seals formed by means of the propinquity between said passageways and openings and said substrate carriers and spacers;
    said plurality of substrate carriers and spacers operatively associated with said elongated central core whereby to divide said core into a continuous elongated substrate treating and handling section comprised of said sealing and substrate treating chambers and a coextensive opposed section, said sections being isolated from each other;
    each of said junction units communicating with said opposed central core section and collectively providing means to subject adjacent isolated chamber portions comprising said opposed section to either an exhaust means or to a flush gas; and
    each of said junction units communicating with said substrate treating and handling core section and collectively providing means to subject adjacent isolated chamber portions comprising said treating and handling section with appropriate ones of sealing gases, substrate treatint gases and exhaust means;
    whereby all of the chamber sections are maintained isolated frome one another and from ingress of the atmosphere.

2. A reactor according to claim 1 wherein the exhaust means of at least one junction unit is the common exhaust for the chamber portions adjacent thereto.

3. A reactor according to claim 1 wherein at least one of said junction units includes operatively associated gas infeed and exhaust means whereby the exhaust of gases from the chambers adjacent thereto are maintained isolated from each other.

4. A reactor according to claim 1 wherein each carrier and spacer has a planar surface extending to the opposite sides of said elongated central core.

5. A reactor according to claim 1 wherein said treating chambers comprise a preheat chamber, a cool down chamber and a plurality of deposition chambers.

6. The reactor according to claim 5 wherein said chambers are quartz tubes connected together by said junctions.

7. The reactor according to claim 6 wherein each of the deposition chambers and pre-heat chambers have heating lamps adjacent thereto to provide heat to the substrate as needed during the deposition process.

8. The reactor according to claim 4, wherein the carrier has a central receptacle means comprising an open area and retaining means and transports the substrate in an inverted position so that the deposition surface faces downward in the reactor.

* * * * *